United States Patent
Suh et al.

(10) Patent No.: US 8,436,470 B2
(45) Date of Patent: May 7, 2013

(54) SOLDER JOINT RELIABILITY IN MICROELECTRONIC PACKAGING

(75) Inventors: Daewoong Suh, Phoenix, AZ (US); Stephen E. Lehman, Chandler, AZ (US); Mukul Renavikar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 12/941,894

(22) Filed: Nov. 8, 2010

(65) Prior Publication Data

US 2011/0051376 A1    Mar. 3, 2011

Related U.S. Application Data

(60) Continuation of application No. 12/610,211, filed on Oct. 30, 2009, now Pat. No. 8,018,063, which is a division of application No. 11/602,914, filed on Nov. 20, 2006, now Pat. No. 7,700,476.

(51) Int. Cl.
*H01L 29/72* (2006.01)

(52) U.S. Cl.
USPC .......................................... 257/772; 257/779

(58) Field of Classification Search .................. 257/772, 257/779
See application file for complete search history.

(56) References Cited

U.S. PATENT DOCUMENTS

| | | | |
|---|---|---|---|
| 5,910,644 A | 6/1999 | Goodman et al. | |
| 6,858,475 B2 | 2/2005 | Gurumurthy et al. | |
| 7,148,569 B1 | 12/2006 | Wang | |
| 7,251,880 B2 | 8/2007 | Pearson et al. | |
| 7,282,432 B2 | 10/2007 | Tago et al. | |
| 7,478,741 B1 * | 1/2009 | Newman | 228/103 |
| 2004/0266070 A1 | 12/2004 | Gurumurthy et al. | |
| 2006/0202352 A1 | 9/2006 | Li et al. | |
| 2006/0209497 A1 * | 9/2006 | Ooi et al. | 361/600 |
| 2006/0252249 A1 | 11/2006 | Hsu et al. | |
| 2007/0045780 A1 | 3/2007 | Akram et al. | |
| 2007/0069346 A1 | 3/2007 | Lin et al. | |
| 2007/0172381 A1 | 7/2007 | Deram | |
| 2007/0228111 A1 | 10/2007 | Vasudevanpillai et al. | |

OTHER PUBLICATIONS

Notice of Allowance received for U.S. Appl. No. 11/602,914, mailed on Jul. 31, 2009, 8 pages.
Office Action received for U.S. Appl. No. 11/602,914, mailed on Jul. 2, 2008, 14 pages.
Office Action received for U.S. Appl. No. 11/602,914, mailed on Dec. 19, 2008, 11 pages.
Office Action for U.S. Appl. No. 12/610,211 mailed Nov. 19, 2010, 7 pgs.
Supplemental Notice of Allowability for U.S. Appl. No. 11/602,914 dated Oct. 30, 2009, 4 pages.
Notice of Allowance for U.S. Appl. No. 12/610,211 dated May 5, 2011, 5 pages.

* cited by examiner

*Primary Examiner* — Edward Wojciechowicz
(74) *Attorney, Agent, or Firm* — Blakely, Sokoloff, Taylor & Zafman LLP

(57) ABSTRACT

A microelectronic assembly and method for fabricating the same are described. In an example, a microelectronic assembly includes a microelectronic device having a surface with one or more areas to receive one or more solder balls, the one or more areas having a surface finish comprising Ni. A solder material comprising Cu, such as flux or paste, is applied to the Ni surface finish and one or more solder balls are coupled to the microelectronic device by a reflow process that forms a solder joint between the one or more solder balls, the solder material comprising Cu, and the one or more areas having a surface finish comprising Ni.

10 Claims, 5 Drawing Sheets

SOLDER JOINT RELIABILITY IN MICROELECTRONIC PACKAGING

CROSS REFERENCE TO RELATED APPLICATIONS

This application is a continuation of and claims priority to U.S. application Ser. No. 12/610,211, filed on Oct. 30, 2009, and U.S. application Ser. No. 11/602,914, filed on Nov. 20, 2006, the disclosure of which is incorporated herein by reference in its entirety for all purposes

TECHNICAL FIELD

Embodiments of the present invention are generally directed to the field of solder joint reliability in microelectronic packaging and, more particularly, to materials associated with solder ball attachment and surface mounting techniques.

BACKGROUND

Solder joints such as ball-grid array (BGA) and bump interconnects are often employed to mechanically and electrically join microelectronic devices during microelectronic packaging such as integrated circuit (IC) packaging. These solder joints may fail when placed under mechanical stresses such as shock, vibration, or drop tests compromising the reliability of microelectronic packages. The most common drop test failure mechanism occurs at weaker defect-rich layers that are created during the soldering reaction.

Current methods to address such solder joint failure include using an underfill to provide additional structural support between the joined microelectronic devices. However, underfill requires costly additional process steps that could be circumvented with strengthened solder joints. Solutions that locally strengthen the joints between solder balls and microelectronic devices by reducing the size of weaker layers while accommodating traditional bulk solder materials for solder balls are needed in the microelectronic packaging industry to reduce solder joint reliability problems and avoid costly process development associated with new bulk solder materials for solder balls.

BRIEF DESCRIPTION OF THE DRAWINGS

Embodiments of the present invention are illustrated by way of example, and not by way of limitation, in the figures of the accompanying drawings in which like reference numerals refer to similar elements and in which.

DETAILED DESCRIPTION

Embodiments of a microelectronic assembly using improved solder joint reliability material(s), associated methods, and systems are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring the specification.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
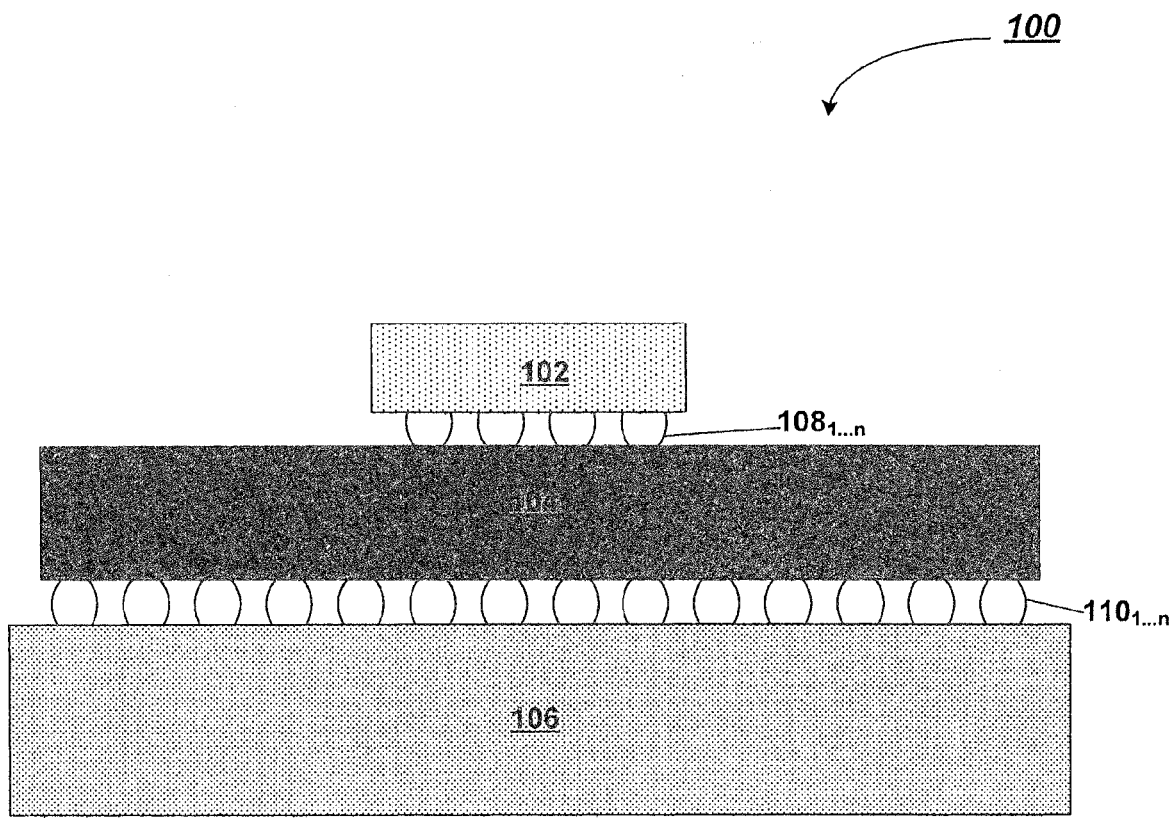
FIG. 1 is a diagram of a microelectronic assembly including microelectronic devices joined by solder balls, according to but one embodiment.

FIG. 1 is a diagram of a microelectronic assembly 100 including microelectronic devices 102, 104, 106, and one or more solder balls $108_{1\ldots n}$, $110_{1\ldots n}$ (where n represents a variable number of repeating structures), each coupled as shown, according to one embodiment.

In one embodiment, microelectronic device 102 is an integrated circuit (IC) such as a processor coupled with a package substrate 104 via one or more solder balls typically called interconnect bumps $108_{1\ldots n}$. In another embodiment, microelectronic device 104 is a package substrate coupled with a circuit board 106 via one or more solder balls $110_{1\ldots n}$, commonly called a ball-grid array (BGA). Improvements to solder joints described herein may apply to ball attachment methods and surface mounting techniques associated with forming solder joints between an IC 102 and package substrate 104, or between a package substrate 104 and circuit board 106, but are not necessarily limited to these microelectronic devices.

In an embodiment, a microelectronic assembly 100 includes an IC 102 coupled with a package substrate 104, the assembly being further coupled with other components, systems, or devices. For example, microelectronic assembly 100 is electrically coupled with another device such as memory, in one embodiment. In another embodiment, a microelectronic assembly 100 includes package substrate 104 coupled with a circuit board 106, the assembly 100 being further coupled with another components, systems, or devices. In an example, such microelectronic assembly 100 is electrically coupled with memory.

One or more solder balls $108_{1\ldots n}$, $110_{1\ldots n}$ may comprise any suitable solderable material. Solder, as referenced in this description to describe one or more solder balls, is any of various solderable materials, including fusible alloys such as lead, silver, or tin, to join parts. Solder, as referenced in this description to describe locally applied materials (see FIGS. 2-3) to the joint interface between a microelectronic device 102, 104, 106 and one or more solder balls $108_{1\ldots n}$, $110_{1\ldots n}$ may include any suitable solderable material in combination with other particular materials described herein. One or more solder balls $108_{1 \ldots n}$, $110_{1 \ldots n}$ are typically spherical in shape, but may be somewhat amorphous before, during, or after the reflow process.

In various embodiments, solder joints between microelectronic devices 102, 104, and 106 are sufficiently strengthened with local strengthening materials such that they don't require underfill to provide additional structural support. Local strengthening of the solder joint area occurs at the interface where the bulk solder alloy of the one or more solder balls $108_{1 \ldots n}$, $110_{1 \ldots n}$ fuses with materials on or near the surfaces of the microelectronic devices 102, 104, 106. Such local strengthening may improve solder joint reliability where failure usually occurs while allowing the use of traditional bulk solder alloys for the solder balls.

Figure 2:
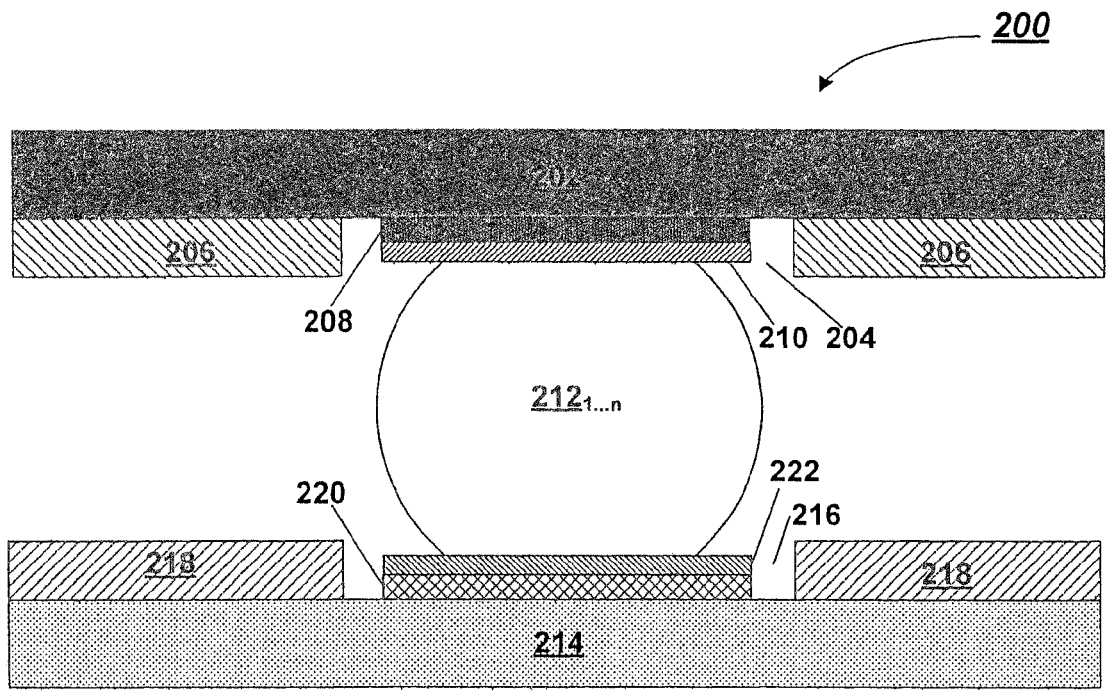
FIG. 2 is another diagram of a microelectronic assembly including microelectronic devices joined by one or more solder balls, according to but one embodiment.

FIG. 2 is another diagram of a microelectronic assembly 200 including microelectronic devices 202, 214 joined by one or more solder balls $212_{1 \ldots n}$, according to but one embodiment. Microelectronic assembly 200 includes a first microelectronic device 202 having one or more areas 204 to receive one or more solder balls, solder resist material 206, surface finish 208, strengthening solder material 210, one or more solder balls $212_{1 \ldots n}$, second microelectronic device 214 having one or more areas 216 to receive one or more solder balls, solder resist material 218, surface finish 220, and strengthening solder material 222, each coupled as shown, according to one embodiment.

In one embodiment, assembly 200 includes a first microelectronic device 202 having a surface with one or more areas 204 to receive one or more solder balls. In an embodiment, the one or more areas 204 are openings in a solder resist material 206. The one or more areas 204 have a surface finish 208 according to one embodiment.

A surface finish 208 forms a metallurgical bond between one or more solder balls $212_{1 \ldots n}$, solder material 210, and the microelectronic device 202 through the formation of intermetallic compound (IMC). In one embodiment, a surface finish 208 comprising nickel (Ni) is coupled to one or more areas 204 of the first microelectronic device 202. For example, a surface finish 208 is a Ni-based surface finish such as electroless nickel immersion gold (ENIG) or nickel-palladium-gold (Ni—Pd—Au) according to one embodiment. An electrolytic Ni comprises substantially 100% Ni with a thin pure gold (Au) coating to help solderability according to one embodiment. In another embodiment, electroless Ni plating comprises about 90-95 wt % Ni with about 5-10 wt % phosphorous (P). Other Ni-based surface finishes not specifically cited are also in accord with embodiments of an applied surface finish 208.

In another embodiment, a surface finish 208 comprising copper (Cu) is coupled to one or more areas 204 of the first microelectronic device 202. According to one example, a surface finish 208 is a Cu-based surface finish such as Cu organic soldering preservative (OSP) or immersion Ag. A Cu-OSP surface finish comprises about 100% Cu with a thin layer of protective organic coating, for example. Other Cu-based surface finishes not specifically cited are also in accord with embodiments of an applied surface finish 208.

In one embodiment, a solder material 210 is locally applied to surface finish 208. A solder material 210 may be selected for properties that locally strengthen the solder joint interface between a microelectronic device 202 and one or more solder balls $212_{1 \ldots n}$. The selection of a proper solder material 210 considers the thickness of defect-rich layers and intermetallic compounds that may form as a result of a soldering reaction between materials selected for one or more solder balls $212_{1 \ldots n}$ and materials selected for surface finish 208.

In one embodiment, a solder material 210 comprising Cu is coupled with the surface finish 208 of the one or more areas 204. According to one embodiment, a solder material 210 comprising Cu is coupled with a surface finish 208 comprising Ni to reduce the thickness of defect-rich layers and reduce intermetallic compounds that weaken the structural integrity of solder joints. In another embodiment, one or more solder balls $212_{1 \ldots n}$ are coupled by reflow with the first microelectronic device 202 via the one or more areas 204 having a surface finish 208 comprising Ni coupled with a solder material 210 comprising Cu.

A solder material 210 comprising Cu coupled with a surface finish 208 comprising Ni may reduce defect-rich layers that result at the interface of solder reactions by locally increasing the content of Cu. Thermodynamic analysis shows that increased Cu content in solder material 210 suppresses Ni consumption in the interfacial reaction, in turn, reducing Ni depletion in defect-rich layers such as a phosphorous(P)-rich layer, therefore reducing the thickness and density of the P-rich layer itself. A reduction in defect-rich layers such as a P-rich layer strengthens solder joint reliability.

Local application of solder material 210 comprising Cu to the interface region only is superior to increased Cu content of the bulk alloy used for solder balls $212_{1 \ldots n}$ themselves for a variety of reasons. First, solder balls with bulk alloy Cu content have increased overall intermetallic compound thickness (i.e.—Cu—Ni—Sn) at the joint interface in comparison with locally applied solder material 210 with Cu content. Increased intermetallic compounds may weaken solder joints. Second, a new solder alloy for solder balls $212_{1 \ldots n}$ would require costly process development and integration associated with the new materials.

According to one embodiment, solder material 210 is a flux including activators, base resin polymers, thickeners, thixotropic agents, solvents, and Cu particles. In one embodiment, the flux Cu content ranges between about 0.1% to 2% by weight. Cu content within these ranges is achieved by adding Cu nanoparticles or micron-sized powder in one embodiment. In another embodiment, Cu content within these ranges is achieved by adding Cu alloys of various chemistries.

In another embodiment, solder material 210 is a solder paste comprising activators, base resin polymers, thickeners, thixotropic agents, solvents, solder powder, and Cu. In one embodiment, the solder powder Cu content ranges between about 0.5% to 2% by weight. Cu content within these ranges is achieved by using Sn—Ag—Cu alloys in the solder paste in one example embodiment. In another embodiment, Cu content within these ranges is achieved by adding nano-sized or micron-sized Cu powder to paste such as Cu-alloy paste, for example. In an embodiment, solder paste contains about 85-95% by weight of solder powder.

Activators for a flux 210 or solder paste 210 include rosin acids, modified rosin acids, low formula weight acids including diacids such as succinic acid, amine compounds, and ionic salts including halide salts. Activators may function to reduce metal oxides to ionic metal complexes and water. Polymers, thickeners, thixotropic agents, and solvents modify the rheology of the flux or paste. Other analogous suitable materials for a flux 210 or solder paste 210 may be used in accordance with these embodiments.

In one embodiment, a solder material 210 comprising Ni is coupled with the surface finish 208 of the one or more areas 204 of a microelectronic device 202. According to one embodiment, a solder material 210 comprising Ni is coupled with a surface finish 208 comprising Cu to reduce intermetallic compounds that weaken the structural integrity of solder joints. In another embodiment, one or more solder balls $212_1$ ... $_n$ are coupled by reflow with the first microelectronic device 202 via the one or more areas 204 having a surface finish 208 comprising Cu coupled with a solder material 210 comprising Ni.

Drop reliability improves for Cu-based surface finishes 208 in the presence of Ni, which reduces intermetallic compound thickness such as Cu(III) IMCs. At least Cobalt (Co) and Platinum (Pt) are expected to produce similar results. In one embodiment, a solder material 210 comprising Co, Pt, Ni, or suitable combinations thereof, is coupled with a surface finish 208 comprising Cu to reduce intermetallic compounds that may weaken solder joints. Local application of Ni-containing material 210 (or suitable replacement material including Co or Pt) to the solder joint interface only through flux or paste obviates the need for Ni in the bulk solder of solder balls, for example, eliminating costly process development and integration for new solder ball materials.

According to one embodiment, solder material 210 is a flux including activators, base resin polymers, thickeners, thixotropic agents, solvents, and Ni particles. In one embodiment, the flux Ni content ranges between about 0.1% to 2% by weight. Ni content within these ranges is achieved by adding Ni nanoparticles or micron-sized powder in one embodiment. In another embodiment, Ni content within these ranges is achieved by adding Ni alloys of various chemistries or Ni complexes such as nickel carboxylates, nickel halides, nickel (0)(cyclooctadiene), and related complexes.

In another embodiment, solder material 210 is a solder paste comprising activators, base resin polymers, thickeners, thixotropic agents, solvents, solder powder, and Ni. In one embodiment, the solder powder Ni content ranges between about 0.1% to 2% by weight. Ni content within these ranges is achieved by using Sn—Ag—Ni alloys in one example embodiment. In another embodiment, Ni content within these ranges is achieved by adding nano-sized or micron-sized Ni powder to paste such as Ni-alloy paste, adding Ni alloys of various chemistries, or Ni complexes such as nickel carboxylates, nickel halides, nickel(0)(cyclooctadiene), and related complexes. In an embodiment, solder paste contains about 85-95% by weight of solder powder.

Activators for a flux 210 or solder paste 210 include rosin acids, modified rosin acids, low formula weight acids including diacids such as succinic acid, amine compounds, and ionic salts including halide salts. Activators may function to reduce metal oxides to ionic metal complexes and water. Polymers, thickeners, thixotropic agents, and solvents modify the rheology of the flux or paste. Other analogous suitable materials for a flux 210 or solder paste 210 may be used in accordance with these embodiments.

Turning to another embodiment, a microelectronic assembly 200 further includes a second microelectronic device 214 coupled with the first microelectronic device 202. Second microelectronic device 214 has a surface with one or more areas 216 to receive one or more solder balls $212_{1\ldots n}$. In an embodiment, the one or more areas 216 are openings in a solder resist material 218. The one or more areas 216 have a surface finish 220 according to one embodiment. In one embodiment, the surface finish 220 coupled with the one or more areas 216 comports with various embodiments described above for a surface finish 208 associated with a first microelectronic device 202.

In another embodiment, a solder material 222 is coupled with surface finish 220. The solder material 222 comports with various embodiments already described above for a solder material 210 associated with a first microelectronic device 202 according to one embodiment.

In an embodiment, solder material 222 is coupled with surface finish 220 and one or more solder balls $212_{1\ldots n}$ that are coupled with a first microelectronic device 202. In one embodiment, a surface mount method is used to position a first microelectronic device 202 such that the attached solder balls $212_{1\ldots n}$ are aligned and adjacent to one or more areas 216 of the second microelectronic device 214 to receive the solder balls $212_{1\ldots n}$. A reflow process couples the one or more solder balls $212_{1\ldots n}$ to the second microelectronic device 214 through a joint formed by the solder balls $212_{1\ldots n}$, solder material 222, and surface finish 220.

A first microelectronic device 202 is a package substrate and the second microelectronic device 214 is a circuit board according to an embodiment. In another embodiment, a first microelectronic device 202 is an IC die and the second microelectronic device 214 is a package substrate. In other embodiments, a first microelectronic device 202 is a circuit board and a second microelectronic device 214 is a package substrate or a first microelectronic device 202 is a package substrate and a second microelectronic device 214 is an IC die.

Figure 3:
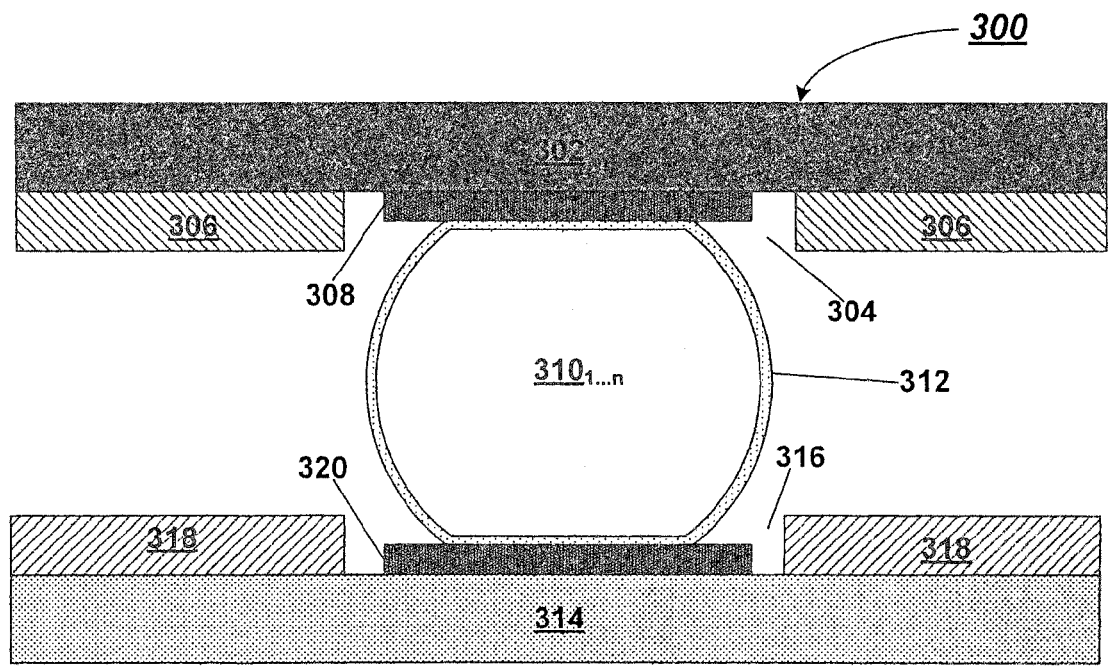
FIG. 3 is another diagram of a microelectronic assembly including microelectronic devices joined by one or more solder balls, according to but one embodiment.

FIG. 3 is another diagram of a microelectronic assembly 300 including microelectronic devices 302, 314 joined by one or more solder balls $310_{1\ldots n}$, according to but one embodiment.

In one embodiment, microelectronic cooling assembly 300 includes a first microelectronic device 302 having one or more areas 304 to receive one or more solder balls, solder resist material 306, surface finish 308, one or more solder balls $310_{1\ldots n}$, strengthening solderable surface material 312, second microelectronic device 314 having one or more areas 316 to receive one or more solder balls, solder resist material 318, and surface finish 320, each coupled as shown, according to one embodiment.

In one embodiment, a first microelectronic device 302 has a surface with one or more areas 304 to receive one or more solder balls, the one or more areas having a surface finish 308 comprising Cu. In an embodiment, surface finish 308 comports with embodiments already described above for a surface finish 208, 220 comprising Cu.

One or more solder balls $310_{1\ldots n}$ having a strengthening solderable surface material 312 are coupled with the first microelectronic device 302 through the one or more areas 304 having the surface finish 308 according to one embodiment. Solderable surface material 312 provides local joint strengthening between solder balls $310_{1\ldots n}$ and surface finish 308. In one embodiment, solderable surface material 312 is materially different from the solder that forms one or more solder balls $310_{1\ldots n}$. In an embodiment solderable surface material 312 comprises Ni particles in amounts ranging from about 0.1% to 2% by weight while one or more solder balls $310_{1\ldots n}$ don't comprise Ni at all. In other embodiments, solderable surface material 312 comprises Ni in accordance with embodiments described above for a solder paste or flux comprising Ni in assembly 200. In an embodiment, solderable surface material 312 is applied to solder balls $310_{1\ldots n}$ by dipping the balls into flux or solder paste. In an embodiment, solderable surface material 312 is only locally applied to the surface portion of one or more solder balls that comes into reactive contact with surface finishes 308 and 320 during reflow. Solderable surface material 312 may be applied to solder balls $310_{1\ldots n}$ using any suitable coating method.

In an embodiment, a second microelectronic device 314 is coupled with a first microelectronic device 302 via one or more solder balls $310_{1\ldots n}$ having a solderable surface material 312. Second microelectronic device 314 has a surface with one or more areas 316 to receive one or more solder balls, the one or more areas having a surface finish 320 comprising Cu. In an embodiment, surface finish 320 comports with embodiments already described above for a surface finish 208, 220 comprising Cu.

Coating solder balls $310_{1...n}$ with a solderable surface material 312 provides local strengthening of a solder joint interface between solder balls $310_{1...n}$ and microelectronic devices 302, 314 by reducing the thickness of weaker layers that form during soldering reaction while still allowing use of traditional bulk solder alloys for solder balls (i.e.—solder balls that don't comprise Cu or Ni at all). As described in assembly 200, solder joints including Cu-based surface finishes 308, 320 benefit from use of local solder materials 312 comprising Ni (or similar elements such as Co and Pt) while solder joints involving Ni-based surface finishes 308, 320 benefit from use of local solder materials 312 comprising Cu. Such embodiments provide flexibility of tailoring interfacial microstructure properties based upon different surface finishes without changing bulk solder alloy of solder balls $310_{1...n}$. For example, dissimilar surface finishes on a package substrate 202 and circuit board 202 could benefit from such embodiments.

Accordingly, in another embodiment, assembly 300 includes surface finishes 308, 320 comprising Ni and solderable surface material 312 comprises Cu. In one embodiment, surface finishes 308, 320 comprising Ni comport with embodiments already described for surface finishes 208, 220 and solderable surface material 312 comprising Cu comports with embodiments already described for solderable material such as fluxes or pastes comprising Cu in assembly 200.

In another embodiment, assembly 300 incorporates embodiments already described for first 202 and second 214 microelectronic devices in assembly 200.

Figure 4:
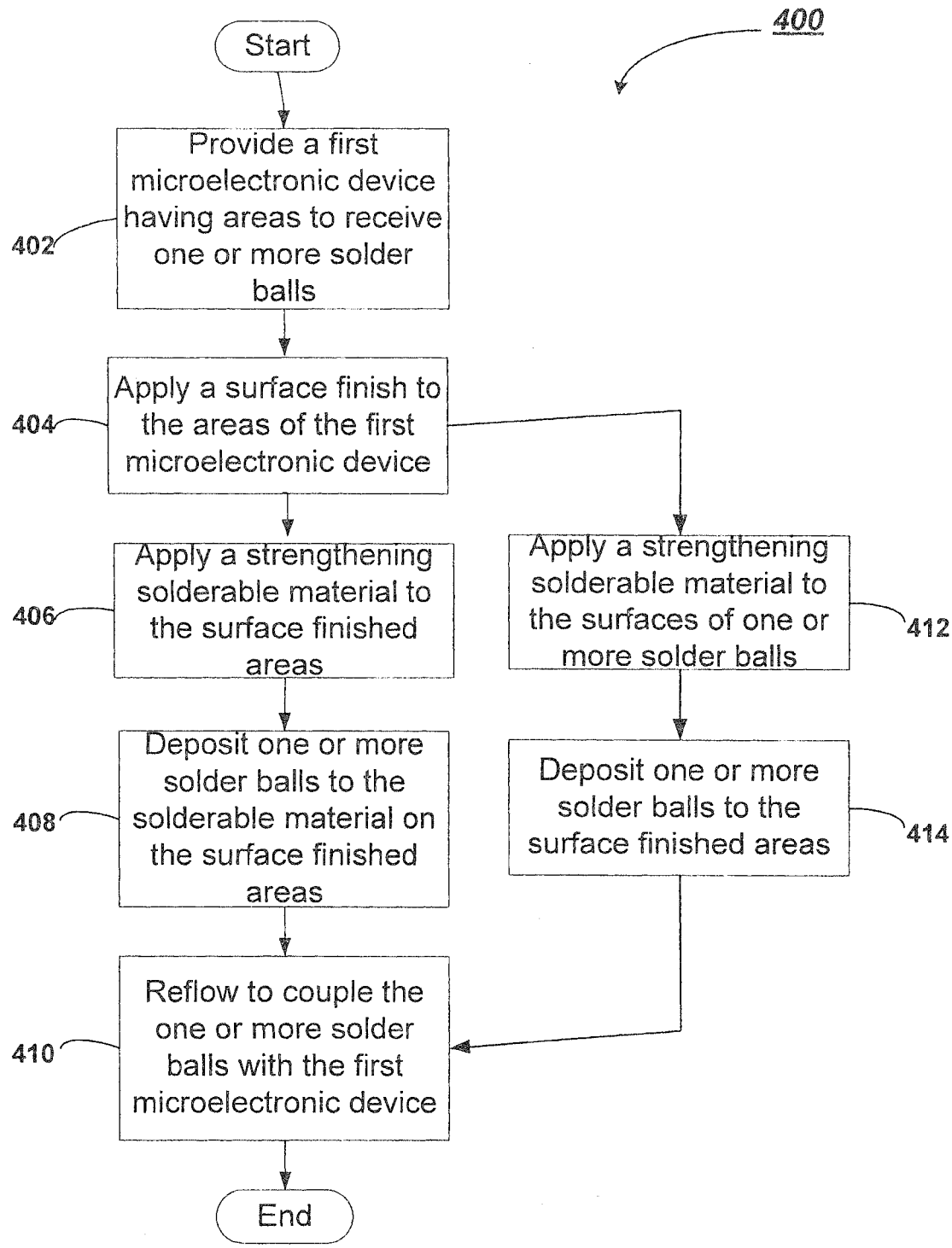
FIG. 4 is a flow diagram illustrating one of multiple methods for coupling one or more solder balls to a microelectronic device, according to but one embodiment.

FIG. 4 is a flow diagram illustrating one of multiple methods for coupling one or more solder balls to a microelectronic device, according to but one embodiment. Method 400 describes a solder ball attachment method according to one embodiment. A method 400 for coupling one or more balls to a microelectronic device includes providing a first microelectronic device having areas to receive one or more solder balls 402, applying a surface finish to the areas of the first microelectronic device 404, applying a strengthening solderable material to the surface finished areas 406, depositing one or more solder balls to the solderable material on the surface finished areas 408, and reflowing to couple the one or more solder balls with the first microelectronic device 410, according to one embodiment.

According to another embodiment, method 400 includes providing a first microelectronic device having areas to receive one or more solder balls 402, applying a surface finish to the areas of the first microelectronic device 404, applying a strengthening solderable material to the surfaces of one or more solder balls 412, depositing one or more solder balls to the surface finished areas, and reflowing to couple the one or more solder balls with the first microelectronic device 410, according to one embodiment.

Providing a first microelectronic device having a surface with one or more areas to receive one or more solder balls 402 includes providing an IC chip, package substrate, or circuit board in one embodiment. A surface finish comprising Ni or Cu may be applied to the one or more areas by any suitable deposition technique 404. In an embodiment, a surface finish comprising Ni or Cu comports with various embodiments already described.

In an embodiment, a strengthening solderable material is applied to the surface finish 406 and one or more solder balls are deposited to the solderable material on the surface finished areas 408. The applied solderable material may comprise Cu or Ni and/or comport with various embodiments for a solderable material heretofore described. A solderable material may be applied 406 by stencil or screen printing or any other suitable deposition technique. Depositing one or more solder balls 408 may be accomplished by any suitable solder ball placement or forming technique.

In an alternative embodiment, a strengthening solderable material is applied to the surfaces of one or more solder balls 412 and one or more solder balls are deposited to the surface finished areas 414. For example, a strengthening solderable material comprising Cu or Ni is applied to the surfaces of one or more solder balls 412. Coating one or more balls with a solderable material 412 comprising Cu or Ni may be accomplished by dipping the solder balls into Cu or Ni flux or paste or any other suitable method. In an embodiment, solderable surface material is only locally applied to the surface portion of one or more solder balls that comes into reactive contact with surface finishes during reflow. Depositing one or more solder balls 414 may be accomplished by any suitable solder ball placement technique.

In either case (solderable material coating on solder balls or solderable material coating on surface finish), a solderable material provides the advantage of favorably altering solder reaction chemistries to the solder joint interface area only where failure usually occurs while accommodating use of traditional BGA or bump materials for the solder balls.

One or more solder balls are reflowed to couple the one or more solder balls with the first microelectronic device 410. Solder reaction chemistries at the interface between one or more solder balls, strengthening solder material, and surface finish may produce fewer defects and reduce defect-rich layers, and/or reduce joint weakening intermetallic compounds.

In the case of a surface finish comprising Ni, defect-rich layers that result at the interface of solder reactions are reduced by locally increasing the content of Cu. Locally increasing the content of Cu may be accomplished by either local application of strengthening solderable material comprising Cu to the surface finish or coating the solder balls with a strengthening solderable coating comprising Cu. Thermodynamic analysis shows that increased Cu content in solder material suppresses Ni consumption in the interfacial reaction, in turn, reducing Ni depletion in defect-rich layers such as a phosphorous(P)-rich layer, therefore reducing the thickness and density of the P-rich layer itself. A reduction in defect-rich layers such as a P-rich layer strengthens solder joint reliability. Similar results are achieved by locally increasing Ni content to a surface finish comprising Cu using analogous methods and reasoning already described in previous embodiments.

Figure 5:
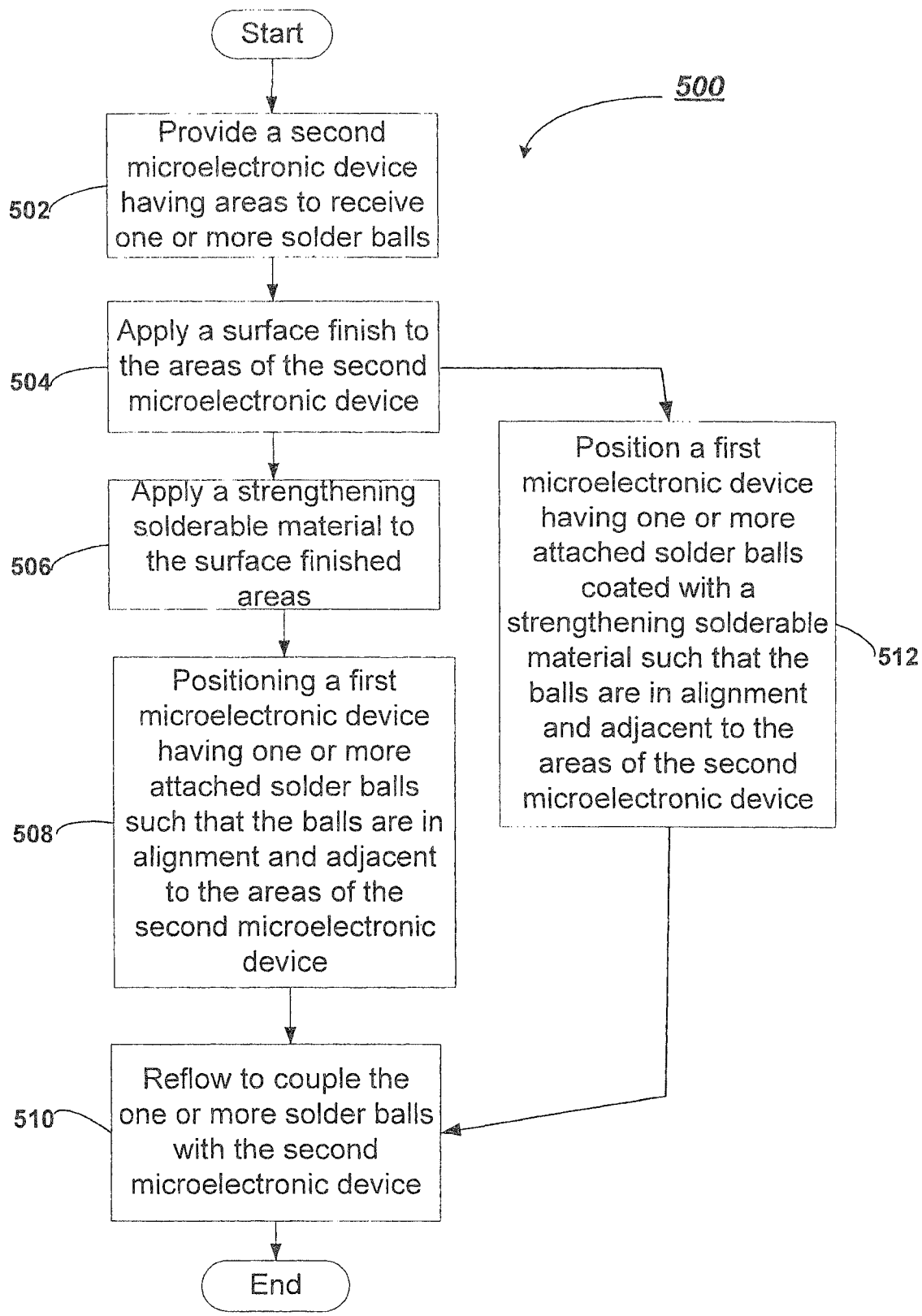
FIG. 5 is another flow diagram illustrating one of multiple methods for coupling one or more solder balls to a microelectronic device, according to but one embodiment.

FIG. 5 is another flow diagram illustrating one of multiple methods for coupling one or more solder balls to a microelectronic device, according to but one embodiment. Method 500 describes a surface mount method according to one embodiment. A method 500 includes providing a second microelectronic device having areas to receive one or more solder balls 502, applying a surface finish to the areas of the second microelectronic device 504, applying a strengthening solderable material to the surface finished areas 506, positioning a first microelectronic device having one or more attached solder balls such that the balls are in alignment and adjacent to the areas of the second microelectronic device 508, reflowing to couple the one or more solder balls with the second microelectronic device 510, according to one embodiment.

In another embodiment, a method 500 includes providing a second microelectronic device having areas to receive one or more solder balls 502, applying a surface finish to the areas of the second microelectronic device 504, positioning a first microelectronic device having one or more attached solder balls, the solder balls coated with a strengthening solderable material, such that the balls are in alignment and adjacent to the areas of the second microelectronic device 512, and reflowing to couple the one or more solder balls with the second microelectronic device 510.

Providing a second microelectronic device having a surface with one or more areas to receive one or more solder balls 502 includes providing an IC chip, package substrate, or circuit board in one embodiment. A surface finish comprising Ni or Cu may be applied to the one or more areas of the second microelectronic device by any suitable deposition technique 504. In an embodiment, a surface finish comprising Ni or Cu comports with various embodiments already described.

In an embodiment, a strengthening solderable material is applied to the surface finish 506. The applied solderable material may comprise Cu or Ni and/or comport with various embodiments for a solderable material heretofore described. A solderable material may be applied 506 by stencil or screen printing or any other suitable deposition technique.

A first microelectronic device having one or more attached solder balls is positioned such that the attached balls are in alignment and adjacent to the areas of the second microelectronic device 508. In one embodiment, a first microelectronic device has one or more attached solder balls that have been previously coupled using a method such as method 400. In another embodiment, a second microelectronic device is positioned such that the areas of the second microelectronic device are in substantial alignment and adjacent to the one or more attached solder balls of a first microelectronic device.

In an alternative embodiment, a first microelectronic device having one or more attached solder balls, the solder balls coated with a strengthening solderable material, is positioned such that the balls are in alignment and adjacent to the areas of the second microelectronic device 512. In another embodiment, a second microelectronic device is positioned such that the areas of the second microelectronic device are in substantial alignment and adjacent to one or more attached solder balls of a first microelectronic device, the solder balls coated with a strengthening material. In an embodiment, one or more solder balls are coupled to a first microelectronic device and coated with a strengthening material according to method 400 and more specifically embodiments 412 and 414 of method 400.

One or more solder balls are reflowed to couple the one or more solder balls with the second microelectronic device 510. In an embodiment, the one or more solder balls are coupled with a first microelectronic device according to method 400. Solder reaction chemistries at the interface between one or more solder balls, strengthening solder material, and surface finish may produce fewer defects and reduce defect-rich layers, and/or reduce joint weakening intermetallic compounds. Such benefits that have previously been described for solder joint interfaces for improved solder joint reliability in accordance with other embodiments also apply here 510.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 6:
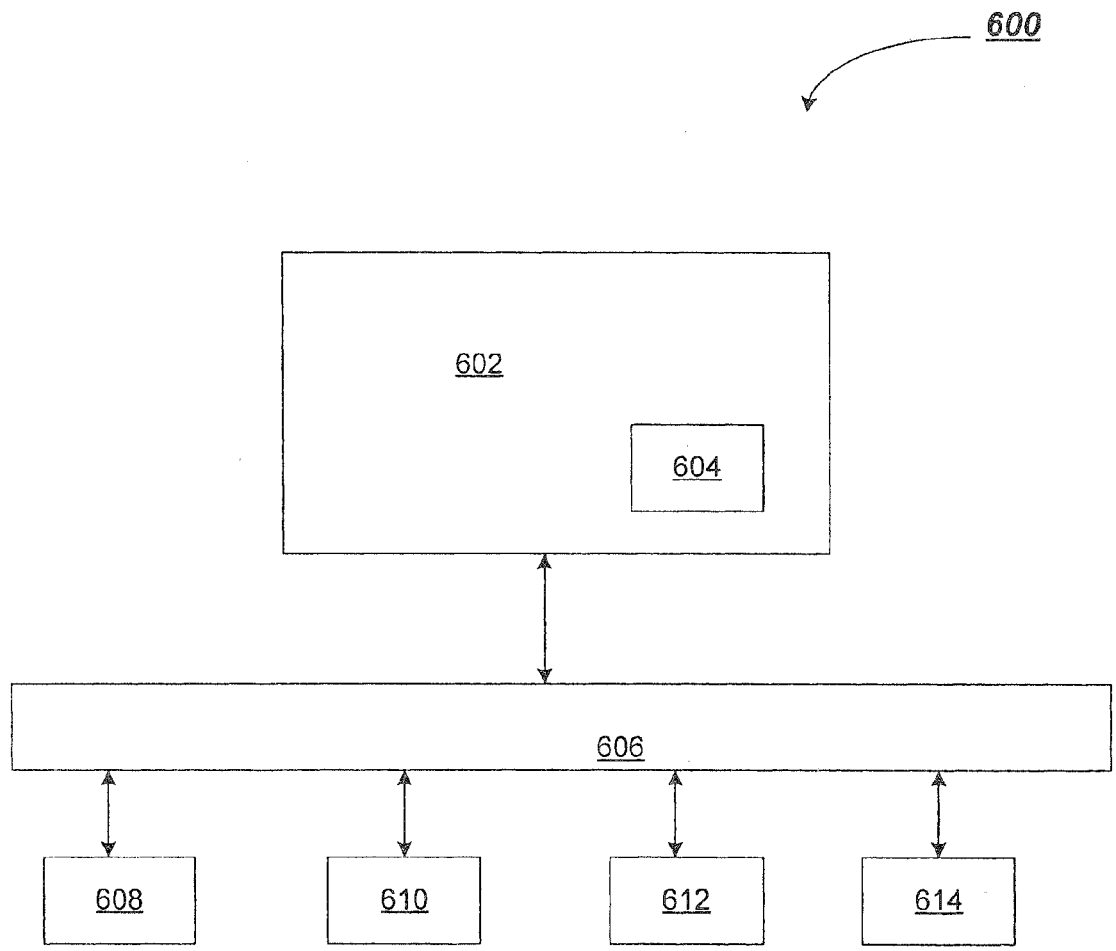
FIG. 6 is a diagram illustrating an example system in which embodiments of the present invention may be used.

FIG. 6 is a diagram illustrating an example system in which embodiments of the present invention may be used. In one embodiment, an electronic assembly 602 includes a microelectronic assembly 604 that accords with assemblies 100, 200, and/or 300 and the various embodiments as described herein. Assembly 602 may further include another microelectronic device or assembly, such as a microprocessor or multiple microprocessors. In an alternate embodiment, the electronic assembly 602 may include an application specific IC (ASIC) or multiple ASICs. Integrated circuits found in chipsets (e.g., graphics, sound, and control chipsets) may also be packaged in accordance with embodiments of this invention.

For the embodiment depicted by FIG. 6, the system 600 may also include a main memory 608, a graphics processor 610, a mass storage device 612, and/or an input/output module 614 coupled to each other by way of a bus 606, as shown. Examples of the memory 608 include but are not limited to static random access memory (SRAM) and dynamic random access memory (DRAM). Examples of the mass storage device 612 include but are not limited to a hard disk drive, a compact disk drive (CD), a digital versatile disk drive (DVD), and so forth. Examples of the input/output module 614 include but are not limited to a keyboard, cursor control arrangements, a display, a network interface, and so forth. Examples of the bus 606 include but are not limited to a peripheral control interface (PCI) bus, and Industry Standard Architecture (ISA) bus, and so forth. In various embodiments, the system 600 may be a wireless mobile phone, a personal digital assistant, a pocket PC, a tablet PC, a notebook PC, a desktop computer, a set-top box, a media-center PC, a DVD player, or a server.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An assembly comprising:
   a circuit board;
   a device including a package substrate and an integrated circuit (IC) die disposed on a first side of the package substrate; and
   a number of interconnects electrically coupling the device with the circuit board, each interconnect extending between an opposing second side of the package substrate and a surface of the circuit board;
   wherein at least one of the interconnects includes
      a first area to receive a solder ball disposed on the second side of the package substrate;
      a first surface finish disposed in the first area, the first surface finish including nickel and phosphorous;
      a second area to receive a solder ball disposed on the surface of the circuit board;
      a second surface finish disposed in the second area, the second surface finish including nickel and phosphorous; and
      a reflowed solder bump coupled with the first surface finish and with the second surface finish, the reflowed solder bump including tin, silver, and copper, wherein the reflowed solder bump forms an intermetallic with at least one of the first and second surface finishes, the intermetallic including nickel, phosphorous, tin, and silver, with the balance being an amount of copper that is greater than the amount of copper present in a bulk of the solder bump.

2. The assembly of claim 1, further comprising a memory coupled with the device.

3. The assembly of claim 2, wherein the IC die comprises a processing system.

4. The assembly of claim 1, wherein each of the first and second surface finishes comprises between about 5 and 10 percent by weight phosphorous.

5. The assembly of claim 1, wherein the reflowed solder bump comprises between about 0.5 and 2 percent by weight copper.

6. The assembly of claim 1, wherein no underfill material is present between the second surface of the package substrate and the surface of the circuit board.

7. A solder joint comprising:
 a first interface adjacent a first substrate, the first interface including nickel and between about 5 and 10 percent by weight phosphorous;
 a second interface adjacent a second substrate, the second interface including nickel and between about 5 and 10 percent by weight phosphorous; and
 a reflowed solder joining the first interface with the second interface, the solder including tin, silver, and between about 0.5 and 2 percent by weight copper, wherein the reflowed solder and at least one of the first and second interfaces comprises an intermetallic of nickel, phosphorous, tin, and silver, with the balance of the intermetallic being an amount of copper that is greater than the amount of copper present in a bulk of the solder.

8. The solder joint of claim 7, wherein no underfill material is present between the first substrate and the second substrate.

9. The solder joint of claim 7, wherein the first substrate comprises a package substrate and the second substrate comprises a circuit board, and wherein an integrated circuit (IC) die is disposed on the package substrate.

10. The solder joint of claim 7, wherein the first substrate comprises an IC die and the second substrate comprises a package substrate.

* * * * *